United States Patent
Tang et al.

(10) Patent No.: US 8,900,887 B2
(45) Date of Patent: Dec. 2, 2014

(54) METHOD FOR ETCHING POLYSILICON GATE

(71) Applicant: Shanghai Huali Microelectronics Corporation, Shanghai (CN)

(72) Inventors: Zaifeng Tang, Shanghai (CN); Chao Fang, Shanghai (CN); Yukun Lv, Shanghai (CN); HsuSheng Chang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 129 days.

(21) Appl. No.: 13/730,532

(22) Filed: Dec. 28, 2012

(65) Prior Publication Data

US 2014/0106475 A1 Apr. 17, 2014

(30) Foreign Application Priority Data

Oct. 12, 2012 (CN) .......................... 2012 1 0388740

(51) Int. Cl.
  *H01L 21/00* (2006.01)
  *H01L 21/66* (2006.01)
(52) U.S. Cl.
  CPC ................. *H01L 22/26* (2013.01); *H01L 22/12* (2013.01)
  USPC .................................................. 438/7; 438/16
(58) Field of Classification Search
  USPC ...................................................... 438/7–16
  See application file for complete search history.

(56) References Cited

U.S. PATENT DOCUMENTS

| 5,780,316 A * | 7/1998 | Chew et al. ..................... 438/11 |
| 6,821,859 B2 * | 11/2004 | Raebiger et al. .............. 438/303 |
| 8,229,588 B2 * | 7/2012 | Tsen et al. .................... 700/121 |

* cited by examiner

*Primary Examiner* — Richard Booth
(74) *Attorney, Agent, or Firm* — Muncy, Geissler, Olds & Lowe, P.C.

(57) ABSTRACT

A method for etching a polysilicon gate is disclosed, wherein the polysilicon gate includes an undoped polysilicon portion and a doped polysilicon portion that is situated on the undoped polysilicon portion. The method includes: obtaining a thickness of the undoped polysilicon portion and a thickness of the doped polysilicon portion by using an optical linewidth measurement device; and etching the undoped polysilicon portion and the doped polysilicon portion by using two respective steps with different parameters, respective etching time for the undoped polysilicon portion and the doped polysilicon portion of every wafer being adjusted in real time by using an advanced process control system. This method enables the doped and undoped polysilicon portions of each polysilicon gate on every wafer to have substantially consistent profiles between each other.

4 Claims, 3 Drawing Sheets

METHOD FOR ETCHING POLYSILICON GATE

CROSS-REFERENCES TO RELATED APPLICATIONS

This application claims the priority of Chinese patent application number 201210388740.8, filed on Oct. 12, 2012, the entire contents of which are incorporated herein by reference.

TECHNICAL FIELD

The present invention relates to semiconductor fabrication technologies and more particularly to a method for etching a polysilicon gate.

BACKGROUND

In processes of 65 nm technology node and below, in order to reduce the resistance and the parasitic depletion-region capacitance of a polysilicon gate and thereby to improve the overall performance of the device, part of the polysilicon gate is usually doped with a certain amount of dopant ions and thereby the polysilicon gate is formed into a composite structure consisting of a doped upper portion and an undoped lower portion. However, in such structure, affected by the existence of the dopant ions, the doped portion has an etching rate higher than that of the undoped portion even under the same etching and cleaning conditions, which leads to different profiles between the doped portion and undoped portion after etch, as shown in FIG. 1, wherein an etched doped portion 104 and an etched undoped portion 103 are formed on a gate oxide layer 102 that is formed on a semiconductor substrate 101, and the etched doped portion 104 has a smaller width than that of the etched undoped portion 103 (as indicated by the area of the figure marked with an oblong). Such profile difference will lead to a gate with an unsatisfying profile and a relatively large deviation in size which will affect the overall performance of the device.

A method for etching polysilicon gate of the prior art developed for solving the above issue of different profiles between the etched doped and undoped portions includes the following steps of:

manually measuring the thickness of the doped polysilicon portion according to an analytical image of a cross section obtained by using cross-section analysis means, e.g., a transmission electron microscopy (TEM);

etching the doped and undoped polysilicon portions in two respective steps with different parameters; and defining different etching times, which will be kept constant in subsequent etching processes, respectively for the two portions according to a formula based on the above measured thicknesses of both the doped and undoped polysilicon portions.

Nevertheless, this method has drawbacks as follows:

First, errors will be inevitably generated in manual thickness measurement for the doped polysilicon portion.

Second, the result obtained from a limited number of samples (generally 1 or 2 samples) may not work for wafers of different lots, as wafer characteristics vary with lot in growth and doping conditions.

Third, the etching time is fixed and would not be adjusted for any single wafer according to its growth or doping condition.

Therefore, the method for etching polysilicon gate of the prior art is lack of universality in addressing the issue of different profiles between etched doped portion and undoped portion of a polysilicon gate.

Thus, there is a need to improve the existing method for etching polysilicon gate so as to effectively increase the profile consistency between the etched doped portion and undoped portion of a polysilicon gate.

SUMMARY OF THE INVENTION

The present invention is directed to the provision of a method for etching a polysilicon gate. The method is capable of improving the etching result of the polysilicon gate.

One aspect of the present invention provides a method for etching a polysilicon gate, the polysilicon gate including an undoped polysilicon portion and a doped polysilicon portion, the doped polysilicon portion being situated on the undoped polysilicon portion, the method for etching a polysilicon gate including:

obtaining a thickness of the undoped polysilicon portion and a thickness of the doped polysilicon portion by using an optical linewidth measurement device; and etching the undoped polysilicon portion and the doped polysilicon portion by using two respective steps with different parameters, respective etching time for the undoped polysilicon portion and the doped polysilicon portion of every wafer being adjusted in real time by using an advanced process control system.

Optionally, obtaining a thickness of the undoped polysilicon portion and a thickness of the doped polysilicon portion includes: measuring a total thickness of the polysilicon gate and a thickness of the doped polysilicon portion by using an optical linewidth measurement device; and obtaining a thickness of the undoped polysilicon portion by subtracting the thickness of the doped polysilicon portion from the total thickness of the polysilicon gate.

Another aspect of the present invention provides a method for etching a polysilicon gate, the polysilicon gate including an undoped polysilicon portion and a doped polysilicon portion, the doped polysilicon portion being situated on the undoped polysilicon portion, the method including the steps of:

measuring a total thickness of the polysilicon gate and a thickness of the doped polysilicon portion by using an optical linewidth measurement device;

obtaining a thickness of the undoped polysilicon portion by subtracting the thickness of the doped polysilicon portion from the total thickness of the polysilicon gate;

etching the undoped polysilicon portion and the doped polysilicon portion by using two respective steps with different parameters; and adjusting in real time, by employing an advanced process control system, respective etching time for the undoped polysilicon portion and the doped polysilicon portion of every wafer during etching the undoped polysilicon portion and the doped polysilicon portion.

Optionally, step of adjusting in real time, by employing an advanced process control system, respective etching time for the undoped polysilicon portion and the doped polysilicon portion of every wafer includes:

calculating etching time needed according to the thickness and etch rate of the doped polysilicon portion and accurately controlling the etching time for the doped polysilicon portion of each wafer based on a real-time feedback from the advanced process control system during etching a doped polysilicon portion of a wafer; and calculating etching time needed according to the thickness and etch rate of the undoped polysilicon portion and accurately controlling the etching time for the undoped polysilicon portion of each wafer based on a real-time feedback from the advanced process control system during etching an undoped polysilicon portion of a wafer.

Optionally, the etching time needed for the doped polysilicon portion is calculated according to the following formula:

$$T_{doped}(S) = H_1 / ER_{doped}$$

where, $T_{doped}(S)$ is the etching time needed for the doped polysilicon portion; $H_1$ is the thickness of the doped polysilicon portion; and $ER_{doped}$ is the etch rate of the doped polysilicon portion.

Optionally, the etching time needed for the undoped polysilicon portion is calculated according to the following formula:

$$T_{undoped}(S) = (H_2 - H_1) / ER_{undoped}$$

where, $T_{undoped}(S)$ is the etching time needed for the undoped polysilicon portion; $H_2$ is the total thickness of polysilicon gate; $H_1$ is the thickness of the doped polysilicon portion; and $ER_{undoped}$ is the etch rate of the undoped polysilicon portion.

Compared with the prior art, the present invention has the following advantages and beneficial effects by adopting the above technical solution.

First, errors generated in manual measurement of the thickness of the doped polysilicon portion according to a cross-sectional TEM image can be avoided and the accuracy of thickness measurement can be increased by obtaining the thicknesses of the doped and undoped polysilicon portions by using an optical linewidth measurement device.

Second, with the employment of an advanced process control system in polysilicon-gate etching processes, real-time adjustment in etching times respectively for the doped and undoped polysilicon portions of every wafer can be achieved, thereby solving the problem that wafers of different lots may need different etching times because of variations in growth and doping conditions between different lots and thus resulting in the beneficial effect that the doped and undoped portions of each polysilicon gate on every wafer have substantially consistent shapes between each other.

DETAILED DESCRIPTION

Figure 1:
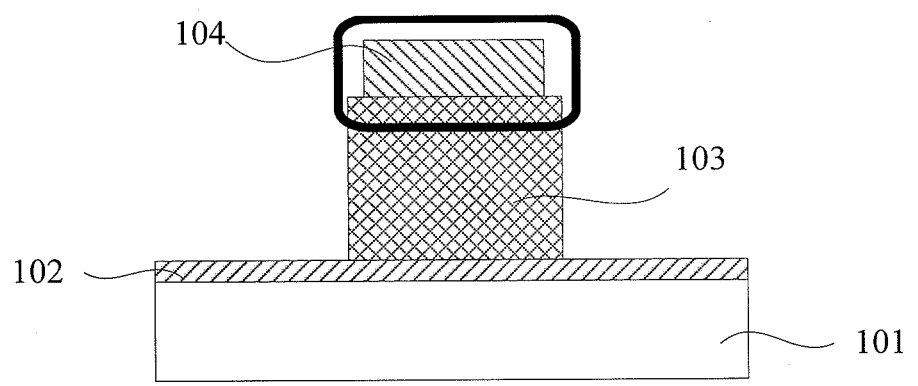
FIG. 1 shows the profiles of etched doped portion and undoped portion of a polysilicon gate according to the prior art.

The method for etching a polysilicon gate provided by the present invention will be further described in details with reference to accompanying drawings and specific embodiments. Advantages and features of the present invention will be apparent from the following description and the appended claims. Note that all the accompanying drawings are presented in a dramatically simplified form and are not precisely to scale, and they are provided to aid in convenience and clearness in describing embodiments of the invention solely.

The core concept of the present invention is to provide a method for etching a polysilicon gate, which includes:

obtaining a thickness of the undoped polysilicon portion and a thickness of the doped polysilicon portion by using an optical linewidth measurement device to increase the accuracy of thickness measurement by avoiding errors that may be generated in manually measuring the thickness of the doped polysilicon portion according to a cross-sectional TEM image; and etching the undoped polysilicon portion and the doped polysilicon portion by using two respective steps with different parameters and adjusting in real time the respective etching time for the undoped polysilicon portion and the doped polysilicon portion of every wafer by using an advanced process control system to solve the problem that wafers of different lots may need different etching time because of variations in growth and doping conditions between different lots, so as to make the etched doped portion and undoped portion of each polysilicon gate on every wafer have substantially consistent profiles between each other.

In a method for etching a polysilicon gate according to one embodiment of the present invention, the polysilicon gate includes an undoped polysilicon portion and a doped polysilicon portion and the doped polysilicon portion that is situated on the undoped polysilicon portion. The method includes: obtaining a thickness of the undoped polysilicon portion and a thickness of the doped polysilicon portion by using an optical linewidth measurement device; and etching the undoped polysilicon portion and the doped polysilicon portion by using two respective steps with different parameters. During the etching steps, the respective etching time for the undoped polysilicon portion and the doped polysilicon portion of every wafer is adjusted in real time by using an advanced process control system.

Further, obtaining a thickness of the undoped polysilicon portion and a thickness of the doped polysilicon portion includes: measuring a total thickness of the polysilicon gate and a thickness of the doped polysilicon portion by using an optical linewidth measurement device; and obtaining a thickness of the undoped polysilicon portion by subtracting the thickness of the doped polysilicon portion from the total thickness of the polysilicon gate.

Further, measuring a total thickness of the polysilicon gate and a thickness of the doped polysilicon portion is conducted in a step of measuring a linewidth of the polysilicon gate by using the optical linewidth measurement device. Measurements of the linewidth and the total thickness of the polysilicon gate are known methods used in the prior art, and the present invention differs from the prior art herein in further including the measurement of the thickness of the doped polysilicon portion in addition to the above two measurements.

Figure 2:
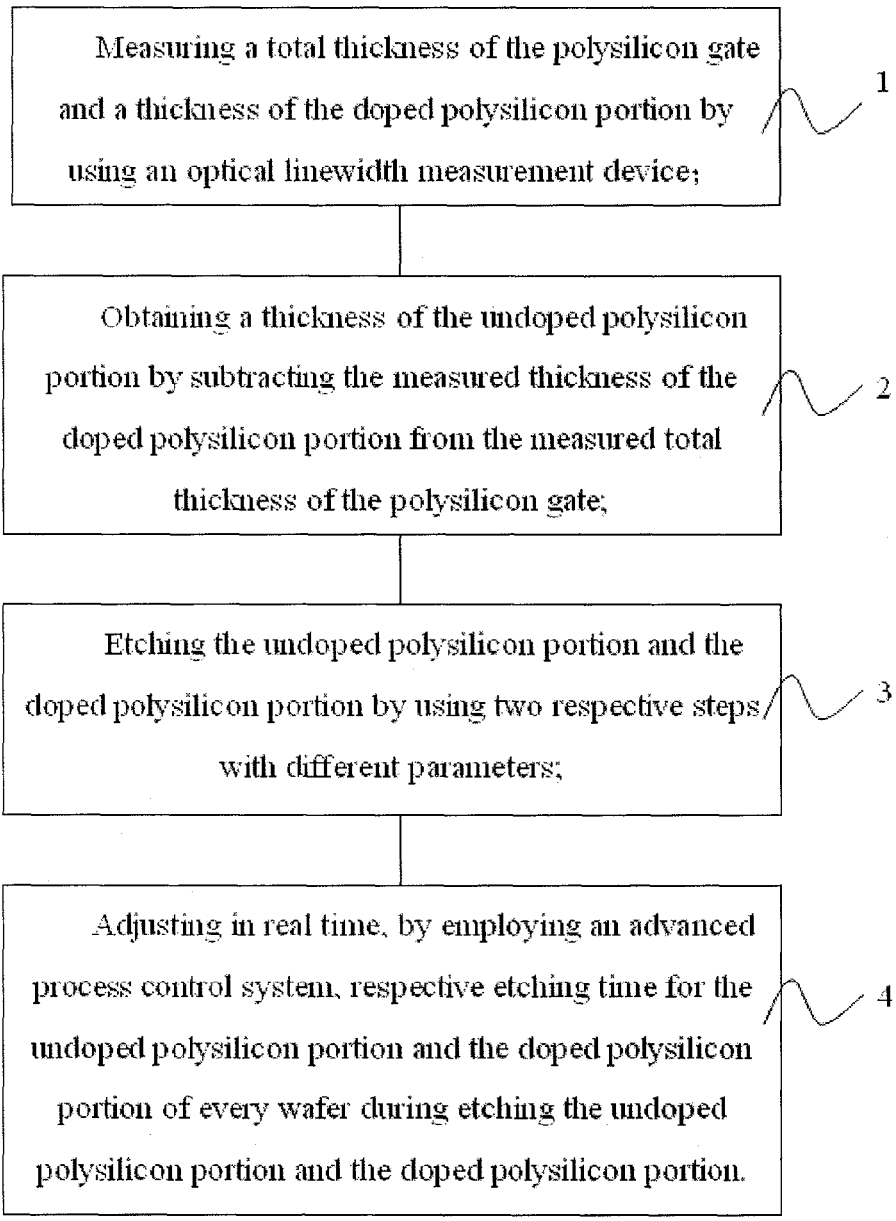
FIG. 2 is a flow chart illustrating a method for etching a polysilicon gate according to an embodiment of the present invention.

FIG. 2 is a flow chart illustrating the method for etching a polysilicon gate according to the embodiment of the present invention. As shown in FIG. 2, the method specifically includes the steps of:

S1: measuring a total thickness of the polysilicon gate and a thickness of the doped polysilicon portion by using an optical linewidth measurement device;

S2: obtaining a thickness of the undoped polysilicon portion by subtracting the thickness of the doped polysilicon portion from the total thickness of the polysilicon gate;

S3: etching the undoped polysilicon portion and the doped polysilicon portion by using two respective steps with different parameters;

S4: adjusting in real time, by employing an advanced process control system, the respective etching time for the undoped polysilicon portion and the doped polysilicon portion of every wafer during etching the undoped polysilicon portion and the doped polysilicon portion.

Further, the step of adjusting in real time, by employing an advanced process control system, respective etching time for the undoped polysilicon portion and the doped polysilicon portion of every wafer includes:

calculating an etching time for the doped polysilicon portion according to the thickness and an etch rate of the doped polysilicon portion and accurately controlling the etching time for the doped polysilicon portion of each wafer based on a real-time feedback from the advanced process control system during etching the doped polysilicon portion of the wafer; and calculating an etching time for the undoped polysilicon portion according to the thickness and an etch rate of the undoped polysilicon portion and accurately controlling the etching time for the undoped polysilicon portion of each wafer based on a real-time feedback from the advanced process control system during etching the undoped polysilicon portion of the wafer.

Further, the etching time needed for the doped polysilicon portion is calculated according to the following formula:

$$T_{doped}(S)=H_1/ER_{doped}$$

where, $T_{doped}(S)$ is the etching time needed for the doped polysilicon portion; $H_1$ is the thickness of the doped polysilicon portion; and $ER_{doped}$ is the etch rate of the doped polysilicon portion.

Further, the etching time needed for the undoped polysilicon portion is calculated according to the following formula:

$$T_{undoped}(S)=(H_2-H_1)/ER_{undoped}$$

where, $T_{undoped}(S)$ is the etching time needed for the undoped polysilicon portion; $H_2$ is the total thickness of polysilicon gate; $H_1$ is the thickness of the doped polysilicon portion; and $ER_{undoped}$ is the etch rate of the undoped polysilicon portion.

Figure 3:
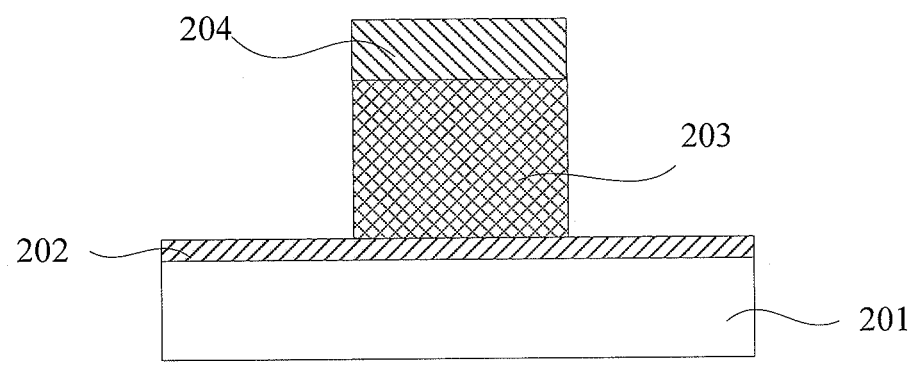
FIG. 3 shows the profiles of etched doped portion and undoped portion of the polysilicon gate according to the method for etching a polysilicon gate of the present invention.

Referring to FIG. 3 which shows the profiles of etched doped and undoped polysilicon portions according to the method for etching a polysilicon gate of the present invention, the etched doped portion 204 and the etched undoped portion 203, both formed on a gate oxide layer 202 that is formed on a semiconductor substrate 201, have a substantially same width, and the whole gate has a good overall profile.

In conclusion, the present invention can increase the accuracy in thickness measurement by avoiding errors that may be generated in manual measurement of the thickness of the doped polysilicon portion according to a cross-sectional TEM image, and can solve the problem that wafers of different lots may need different etching times because of variations in growth and doping conditions between different lots and thus make the doped and undoped portions of each polysilicon gate on every wafer have substantially consistent profiles between each other.

Obviously, those skilled in the art can make various modifications and variations to the present invention without departing from the spirit or scope of the invention. Thus, it is intended that the present invention covers such modifications and variations provided they come within the scope of the appended claims and their equivalents.

What is claimed is:

1. A method for etching a polysilicon gate, the polysilicon gate comprising an undoped polysilicon portion and a doped polysilicon portion, the doped polysilicon portion being situated on the undoped polysilicon portion, the method comprising:

obtaining a thickness of the undoped polysilicon portion and a thickness of the doped polysilicon portion by using an optical linewidth measurement device; and etching the undoped polysilicon portion and the doped polysilicon portion by using two respective steps with different parameters, respective etching time for the undoped polysilicon portion and the doped polysilicon portion of every wafer being adjusted in real time by using an advanced process control system, wherein obtaining a thickness of the undoped polysilicon portion and a thickness of the doped polysilicon portion includes: measuring a total thickness of the polysilicon gate and a thickness of the doped polysilicon portion in a step of measuring a linewidth of the polysilicon gate by using an optical linewidth measurement device; and obtaining a thickness of the undoped polysilicon portion by subtracting the thickness of the doped polysilicon portion from the total thickness of the polysilicon gate.

2. The method according to claim 1, wherein the adjustment step includes:

calculating an etching time for the doped polysilicon portion according to the thickness and an etch rate of the doped polysilicon portion and accurately controlling the etching time for the doped polysilicon portion of each wafer based on a real-time feedback from the advanced process control system during etching the doped polysilicon portion of the wafer; and calculating an etching time for the undoped polysilicon portion according to the thickness and an etch rate of the undoped polysilicon portion and accurately controlling the etching time for the undoped polysilicon portion of each wafer based on a real-time feedback from the advanced process control system during etching the undoped polysilicon portion of the wafer.

3. The method according to claim 2, wherein the etching time for the doped polysilicon portion is calculated according to the following formula:

$$T_{doped}(S)=H_1/ER_{doped}$$

where, $T_{doped}(S)$ is the etching time needed for the doped polysilicon portion; $H_1$ is the thickness of the doped polysilicon portion; and $ER_{doped}$ is the etch rate of the doped polysilicon portion.

4. The method according to claim 2, wherein the etching time for the undoped polysilicon portion is calculated according to the following formula:

$$T_{undoped}(S)=(H_2-H_1)/ER_{undoped}$$

where, $T_{undoped}(S)$ is the etching time needed for the undoped polysilicon portion; $H_2$ is the total thickness of polysilicon gate; $H_1$ is the thickness of the doped polysilicon portion; and $ER_{undoped}$ is the etch rate of the undoped polysilicon portion.

* * * * *